(12) United States Patent
Ikedo

(10) Patent No.: US 10,491,843 B2
(45) Date of Patent: Nov. 26, 2019

(54) SOLID-STATE IMAGE PICKUP ELEMENT, IMAGE PICKUP APPARATUS, AND IMAGE PICKUP METHOD FOR PERFORMING ENCODED EXPOSURE WITH HIGH TEMPORAL RESOLUTION

(71) Applicant: CANON KABUSHIKI KAISHA, Tokyo (JP)

(72) Inventor: Hideki Ikedo, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/987,605

(22) Filed: May 23, 2018

(65) Prior Publication Data

US 2018/0343406 A1 Nov. 29, 2018

(30) Foreign Application Priority Data

May 24, 2017 (JP) .................................. 2017-102480

(51) Int. Cl.
*H04N 5/335* (2011.01)
*H04N 5/369* (2011.01)
*H04N 5/232* (2006.01)
*H01L 27/146* (2006.01)
*H01L 31/107* (2006.01)

(52) U.S. Cl.
CPC ....... *H04N 5/369* (2013.01); *H01L 27/14643* (2013.01); *H01L 31/107* (2013.01); *H04N 5/2327* (2013.01)

(58) Field of Classification Search
CPC .............................. H01L 31/107; G01S 7/4863
See application file for complete search history.

(56) References Cited

U.S. PATENT DOCUMENTS

| 4,710,817 | A  | * | 12/1987 | Ando | H04N 5/357 348/241 |
| 7,639,289 | B2 | * | 12/2009 | Agrawal | G03B 17/00 348/239 |
| 8,822,900 | B2 | * | 9/2014 | Richardson | H04N 5/355 250/214 AG |
| 2007/0258707 | A1 | * | 11/2007 | Raskar | G03B 17/00 396/52 |
| 2017/0131143 | A1 | * | 5/2017 | Andreou | G01J 1/44 |

FOREIGN PATENT DOCUMENTS

| JP | 2009522825 A | 6/2009 |
| JP | 2016039393 A | 3/2016 |

OTHER PUBLICATIONS

Brian F Aull et al. "Geiger-mode avalanche photodiodes for three-dimensional imaging", The Lincoln Laboratory Journal, New York, NY, US, vol. 13, No. 2, Jan. 1, 2002, pp. 335-350, XP002312996 (Year: 2002).*

* cited by examiner

*Primary Examiner* — Gary C Vieaux
(74) *Attorney, Agent, or Firm* — Carter, DeLuca & Farrell LLP

(57) ABSTRACT

A solid-state image pickup element as an embodiment includes: a plurality of pixels each including a sensor that generates pulses with a frequency based on a reception frequency of photons and a counter that counts the number of the pulses; and a setting portion that sets, in an exposure period, a state where the pulses are counted in the pixels and a state where the pulses are not counted in the pixels, with a timing based on an arbitrary pattern.

21 Claims, 14 Drawing Sheets

SOLID-STATE IMAGE PICKUP ELEMENT, IMAGE PICKUP APPARATUS, AND IMAGE PICKUP METHOD FOR PERFORMING ENCODED EXPOSURE WITH HIGH TEMPORAL RESOLUTION

BACKGROUND OF THE INVENTION

Field of the Invention

The present invention relates to a solid-state image pickup element, an image pickup apparatus, and an image pickup method.

Description of the Related Art

In recent years, high functionality of image pickup apparatuses such as digital still cameras or digital video cameras has been progressing. For example, Japanese Patent Application Laid-Open No. 2009-522825 discloses technology that acquires an image not by continuing to open a shutter during an exposure period but by opening/closing the shutter according to a predetermined time pattern, and that performs repair of blurring by computational processing using said time pattern. Such technology is called encoded exposure. The time pattern employed in the encoded exposure is called an encoded exposure pattern. On the other hand, Japanese Patent Application Laid-Open No. 2016-39393 discloses an image pickup apparatus that achieves a reduction in electric power consumption by selecting in a spatially random manner image pickup elements outputting a pixel signal to an analog-digital converter.

However, in the conventional technology, the encoded exposure, and so on, could not necessarily be performed with a sufficiently high temporal resolution.

An object of the present invention is to provide a solid-state image pickup element, an image pickup apparatus, and an image pickup method that enable the likes of encoded exposure to be performed with a high temporal resolution.

SUMMARY OF THE INVENTION

According to one aspect of the embodiments, there is provided a solid-state image pickup element including: a plurality of sensors that generate pulses with a frequency based on a reception frequency of photons; a plurality of counters that count the number of the pulses; and a setting part that sets, in an exposure period, a state where the pulses are counted by the plurality of counters and a state where the pulses are not counted by the plurality of counters, with a timing based on an arbitrary pattern.

Further features of the present invention will become apparent from the following description of exemplary embodiments with reference to the attached drawings.

DESCRIPTION OF THE EMBODIMENTS

Embodiments of the present invention will be described below using the drawings. Note that the present invention is not limited to the embodiments below, and may be appropriately changed. Moreover, the embodiments shown below may be configured appropriately combined.

[First Embodiment]

Figure 1:
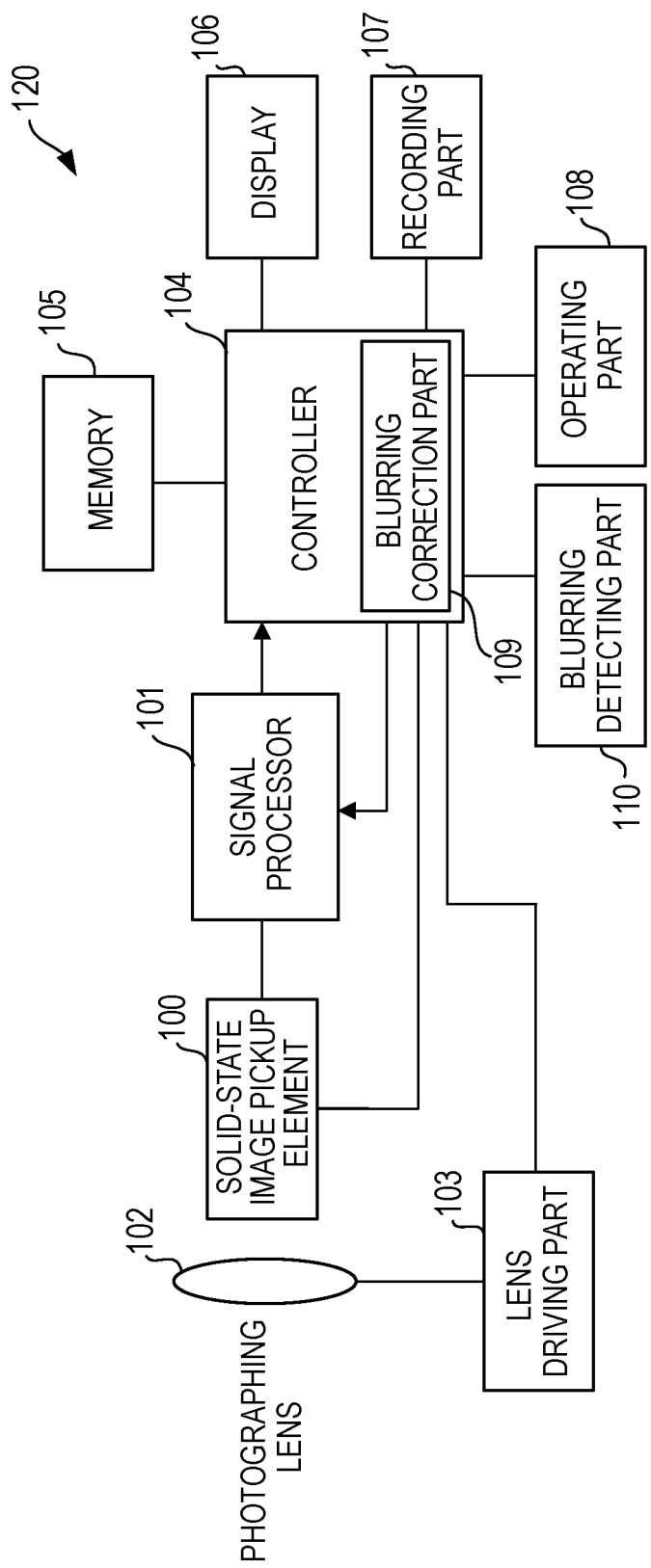
FIG. 1 is a block diagram showing an image pickup apparatus according to a first embodiment.

A solid-state image pickup element, an image pickup apparatus, and an image pickup method according to a first embodiment will be described using FIGS. 1 to 6. FIG. 1 is a block diagram showing the image pickup apparatus according to the present embodiment. As shown in FIG. 1, an image pickup apparatus 120 according to the present embodiment includes a solid-state image pickup element 100, a signal processor t 101, a controller part 104, a memory 105, a display 106, a recording part 107, an operating part 108, a blurring detecting part 110, and a lens driving part 103. In addition, the image pickup apparatus 120 is provided with a photographing lens (image pickup optical system, lens part) 102. The photographing lens 102 may be detachable or may be non-detachable from a body (main body) of the image pickup apparatus 120.

The solid-state image pickup element 100 generates an image pickup signal by performing photoelectric conversion of an optical image of an object formed by the photographing lens 102, and outputs the generated image pickup signal. A unit pixel 201 (refer to FIG. 2) provided in the solid-state image pickup element 100 is provided with an avalanche photodiode, enabling detection of a single photon. In addition, the solid-state image pickup element 100 acquires an image by encoded exposure. The photographing lens 102 causes image formation of the optical image of the object on an image pickup surface of the solid-state image pickup element 100. The lens driving part 103 is for driving the photographing lens 102, and performs the likes of zoom control, focus control, and diaphragm control. The photographing lens 102 forms the optical image of the object and causes the formed optical image to be incident on the image pickup surface of the solid-state image pickup element 100. The signal processor 101 performs predetermined signal processing (image processing) or the like, such as correction processing, on the image pickup signal outputted from the solid-state image pickup element 100. The controller (overall control and arithmetic part, control part) 104 manages control of the image pickup apparatus 120 overall, and performs predetermined arithmetic processing, and so on. The controller 104 outputs the likes of a control signal for driving each of the functional blocks of the image pickup apparatus 120 or control data for controlling the solid-state image pickup element 100. The controller 104 performs predetermined signal processing (image processing) or the like, such as developing or compression, on the image pickup signal that has undergone signal processing, and so on, by the signal processor 101. The controller 104 is provided with a blurring correction part 109. The blurring correction part 109 performs blurring repair processing (blurring correction processing) on the image acquired by encoded exposure in the solid-state image pickup element 100. Details of the blurring repair processing will be mentioned later. The memory 105 temporarily stores image data. The display 106 displays the likes of the image pickup signal that has undergone signal processing, and so on, by the controller 104, or various kinds of setting information of the image pickup apparatus 120. The recording part (recording controller) 107 is provided with an unillustrated recording medium. Such a recording medium may be detachable or may be non-detachable from the recording part 107. The recording part 107 records on the recording medium the likes of the image pickup signal that has undergone signal processing, and so on, by the controller 104. The likes of a semiconductor memory such as a flash memory, for example, may be cited as such a recording medium. The operating part 108 is for performing setting of the likes of a photographing mode or an accumulation period, and is operated by a user, or the like. The operating part 108 is configured by, for example, a button, a dial, and so on. Note that when a display apparatus is a touch panel, said touch panel is also included in the operating part 108. The blurring detecting part 110 is configured by the likes of a gyro sensor or an acceleration sensor. The blurring detecting part 110 detects movement information of the image pickup apparatus 120 during an exposure period. The movement information detected by the blurring detecting part 110 is employed when performing blurring repair processing of a photographed image in the blurring correction part 109.

Figure 2:
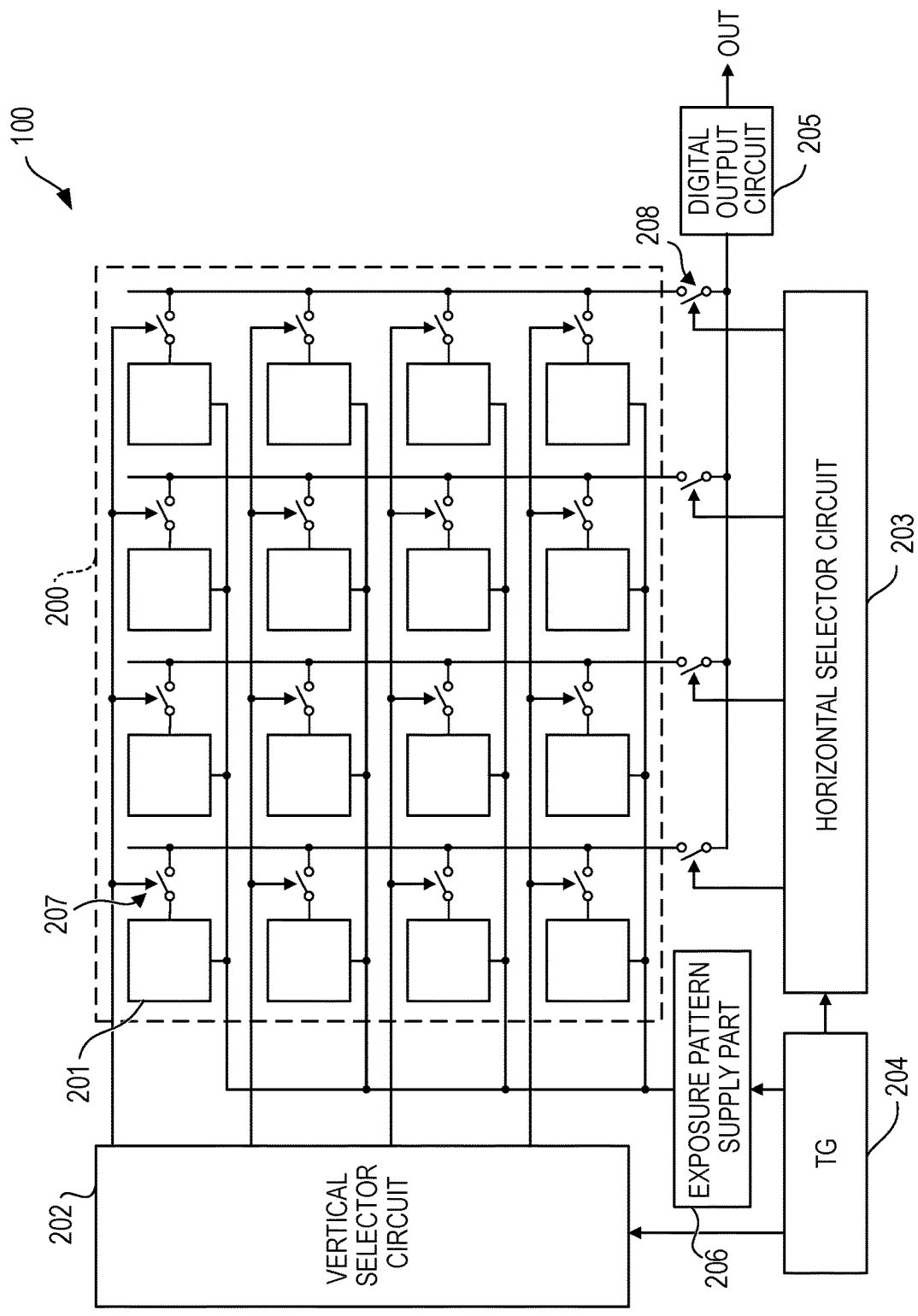
FIG. 2 is a view showing a solid-state image pickup element according to the first embodiment.

FIG. 2 is a view showing the solid-state image pickup element according to the present embodiment. As shown in FIG. 2, the solid-state image pickup element 100 includes a pixel array 200, a vertical selector circuit 202, a horizontal selector circuit 203, a timing generator 204, a digital output circuit 205, and an exposure pattern supply part 206.

The pixel array (pixel array region) 200 has a plurality of the part pixels (pixels) 201 arranged in a matrix therein. Although a 4×4 arrangement of the part pixels 201 is shown here to simplify explanation, in fact, an even larger number of the unit pixels 201 are disposed. The vertical selector circuit 202 selects a plurality of the unit pixels 201 arranged in the pixel array 200, in a unit of a row, by means of a switch 207. The horizontal selector circuit 203 selects the unit pixels 201 arranged in the pixel array 200, in a unit of a column, by means of a switch 208. A signal from the unit pixel 201 selected by combination of the vertical selector circuit 202 and the horizontal selector circuit 203 is outputted to the digital output circuit 205. The digital output circuit 205 outputs the image pickup signal, that is, an image signal (image), to outside of the solid-state image pickup element 100.

The exposure pattern supply part (setting part, encoded exposure pattern supply part) 206 supplies to each of the unit pixels 201 provided in the pixel array 200 an exposure pattern signal (encoded exposure pattern signal) PEN (refer to FIG. 3) for performing encoded exposure. The exposure pattern supply part 206 may function as a setting part by which a state where pulses are counted in the unit pixel 201 and a state where pulses are not counted in the unit pixel 201 are set in the exposure period, with a timing based on an encoded exposure pattern.

The timing generator (TG: Timing Generator, timing generating circuit) 204 supplies control signals to each of the vertical selector circuit 202, the horizontal selector circuit 203, and the exposure pattern supply part 206. Moreover, the timing generator 204 transmits a control signal MTX (refer to FIG. 3) by an unillustrated wiring, also to each of the unit pixels 201.

Figure 3:
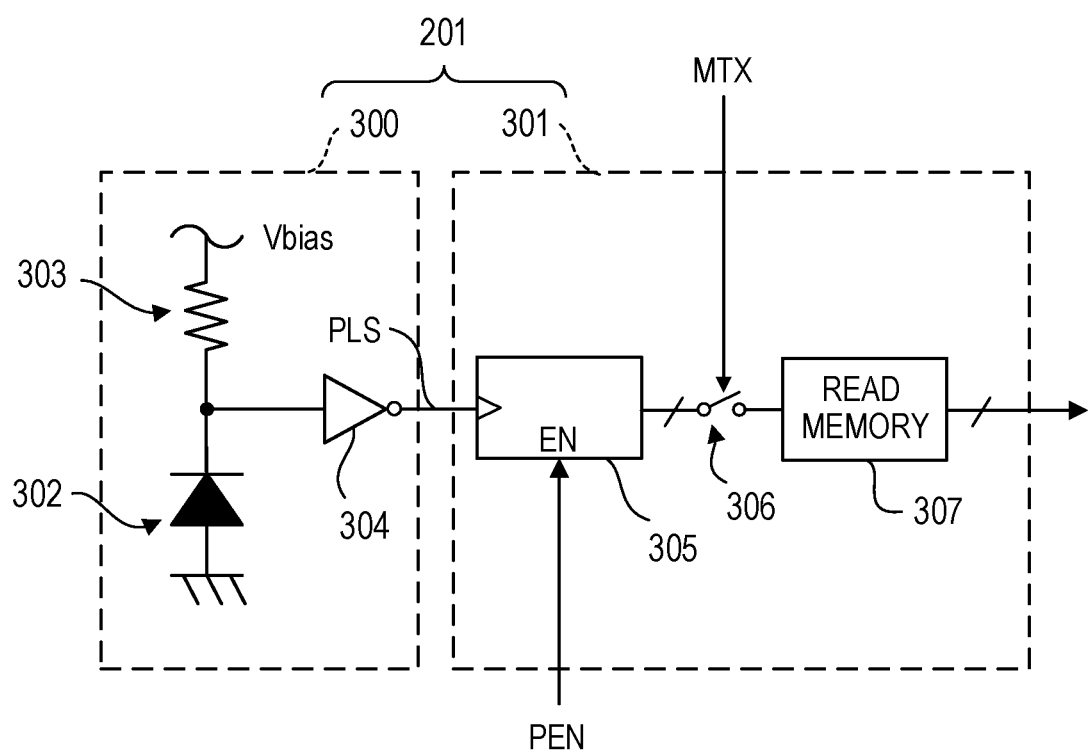
FIG. 3 is a view showing a unit pixel provided in the solid-state image pickup element according to the first embodiment.

FIG. 3 is a view showing the unit pixel provided in the solid-state image pickup element according to the present embodiment. As shown in FIG. 3, the unit pixel 201 includes a sensor part (light receiving part) 300 and a counter 301. The sensor part 300 includes a photodiode 302, a quench resistance 303, and an inverting buffer 304. The photodiode 302 is an avalanche photodiode. An anode of the photodiode 302 is connected to a ground potential, and a cathode of the photodiode 302 is connected to one end of the quench resistance 303. The other end of the quench resistance 303 has applied thereto a bias voltage Vbias. The photodiode 302 has applied thereto, via the quench resistance 303, a bias voltage greater than or equal to a breakdown voltage of the photodiode 302. Therefore, the photodiode 302 operates in a Geiger mode. That is, when a photon (photon) is incident on the photodiode 302, an avalanche multiplication phenomenon is caused. As a result, an avalanche current occurs, and a voltage drop occurs in the quench resistance 303. The quench resistance 303 is a resistance element for stopping the avalanche multiplication phenomenon of the photodiode 302. The quench resistance 303 may be configured utilizing a resistance component of a transistor. When the avalanche current occurs in the photodiode 302 due to the avalanche multiplication phenomenon, the voltage drop occurs in the quench resistance 303, and the bias voltage applied to the photodiode 302 drops. When the bias voltage drops to the breakdown voltage, the avalanche multiplication phenomenon stops. As a result, the avalanche current stops flowing, and the photodiode 302 is again applied with the bias voltage Vbias. The inverting buffer 304 is provided in order to extract as a pulse signal PLS a voltage change that has occurred in the quench resistor 303. As a result, when a photon is incident on the photodiode 302, the pulse signal PLS is outputted from the inverting buffer 304. Thus, pulses are generated from the sensor 300 with a frequency based on a reception frequency of photons.

The counter 301 includes a counter (counter circuit) 305, a switch 306, and a read memory 307. The counter 305 has inputted thereto the pulse signal PLS that occurs due to a photon being incident on the sensor part 300, and the counter 305 counts the number of pulses of the pulse signals PLS. A count value of the pulses due to the counter 305 represents a pixel signal. The counter 305 includes an enable control terminal EN for switching between a state where the pulses are counted and a state where the pulses are not counted. Such an enable control terminal EN has supplied thereto, from the exposure pattern supply part 206, the exposure pattern signal PEN for performing encoded exposure. The exposure pattern signal PEN functions as an enable signal of the counter 305. Moreover, the counter 305 has a resetting signal RES (refer to FIG. 4) supplied thereto from the timing generator 204. A detailed configuration of the counter 305 will be mentioned later using FIG. 4.

The read memory 307 temporarily holds the count value as the pixel signal that has been counted by the counter 305. The switch 306 is for switching whether the count value counted by the counter 305 is transmitted to the read memory 307, or not. The switch 306 is controlled by the control signal MTX supplied from the timing generator 204. The count value being held in the read memory 307 of the unit pixel 201 selected by the vertical selector circuit 202 and the horizontal selector circuit 203, is transmitted to the digital output circuit 205.

Figure 4:
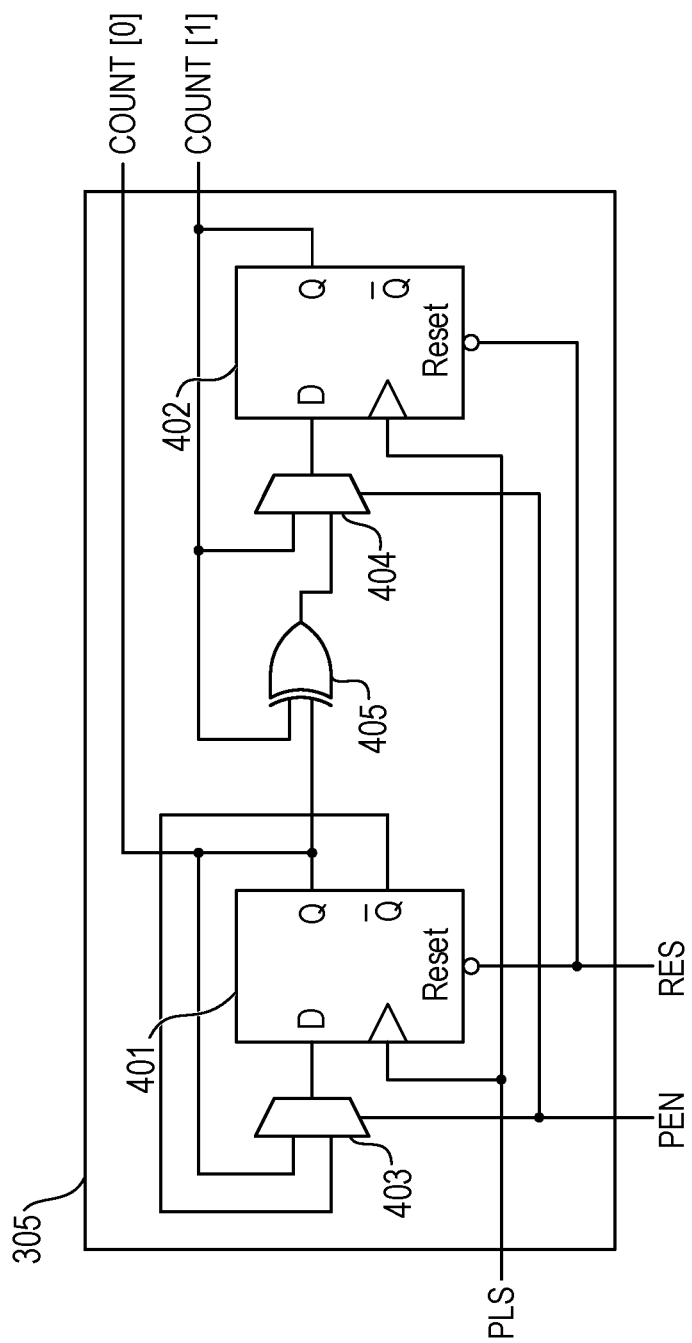
FIG. 4 is a view showing a counter provided in the solid-state image pickup element according to the first embodiment.

FIG. 4 is a view showing the counter provided in the solid-state image pickup element according to the present embodiment. Although, the case of the counter 305 being provided with two D type flip-flop circuits (D-FF) 401, 402, that is, the case of the counter being a 2-bit counter is described here as an example to simplify explanation, the present invention is not limited to this. In order to secure a sufficient dynamic range, it is preferable to employ a counter 305 of a sufficient bit number. When the counter 305 is a 2-bit counter, the counter 305 performs a count of 0→1→2 synchronously with a rising edge of the pulse signal PLS outputted from the sensor 300. Clock terminals of the D-FFs 401, 402 each have inputted thereto the pulse signal PLS outputted from the sensor part 300. Resetting terminals Reset of the D-FFs 401, 402 have inputted thereto the resetting signal RES supplied from the timing generator 204. When the resetting signal RES is H level, Q terminals of the D-FFs 401, 402 are reset to L level. The count values of each bit (COUNT[0], COUNT[1]) are outputted from the Q terminals of the D-FFs 401, 402. Selectors 403, 404 are controlled by the exposure pattern signal PEN. When the exposure pattern signal PEN is L level, an output of the Q terminal of each of the D-FFs 401, 402 is inputted to its D terminal. That is, when the exposure pattern signal PEN is L level, present values are maintained in the D-FFs 401, 402. Therefore, when the exposure pattern signal PEN is L level, the count value does not increase, even if the pulse signal PLS has been inputted. Such a state is called a disabled state. When the exposure pattern signal PEN is H level, the count value increases when the pulse signal PLS is inputted. Therefore, the exposure pattern signal PEN functions as the enable signal of the counter 305. An XOR gate 405 for calculating a carry of the count value is provided between the D-FF 401 and the D-FF 402.

Figure 5:
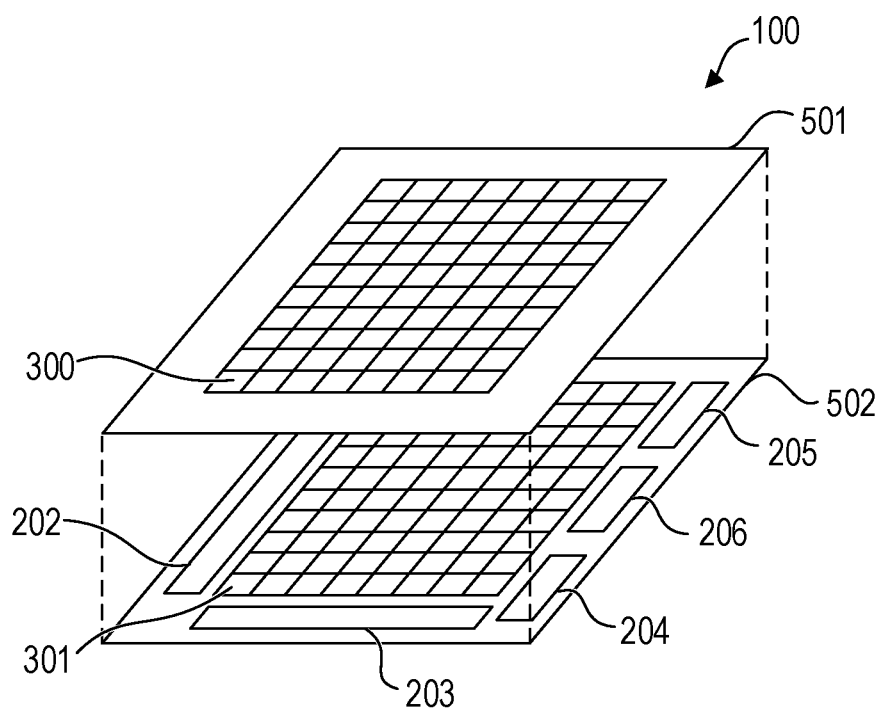
FIG. 5 is a view showing a layout of the solid-state image pickup element according to the first embodiment.

FIG. 5 is a view showing an example of a layout of the solid-state image pickup element according to the present embodiment. As shown in FIG. 5, the solid-state image pickup element 100 has a configuration in which the following, namely, a sensor part substrate 501 having a plurality of the sensor parts 300 arranged in a matrix therein and a counting part substrate 502 having a plurality of the counters 301 arranged in a matrix therein, have been stacked. An electrode (not illustrated) provided in the sensor part substrate 501 and an electrode (not illustrated) provided in the counting part substrate 502 are electrically connected to each other. Thus, there is a configuration by which the pulse signal PLS outputted from the sensor part 300 provided in the sensor part substrate 501 is inputted to the counter 301 provided in the counting part substrate 502. The counting part substrate 502 is provided with the vertical selector circuit 202, the horizontal selector circuit 203, the timing generator 204, the digital output circuit 205, and the exposure pattern supply part 206. Because the sensor part 300 and the counter 301 are provided in separate substrates, an area of the sensor part 300 can be secured in large measure. Note that the configuration of the solid-state image pickup element 100 is not limited to the above-described kind of configuration, and it is possible to configure so that the sensor part 300 and the counter 301 are provided in the same substrate.

Figure 6:
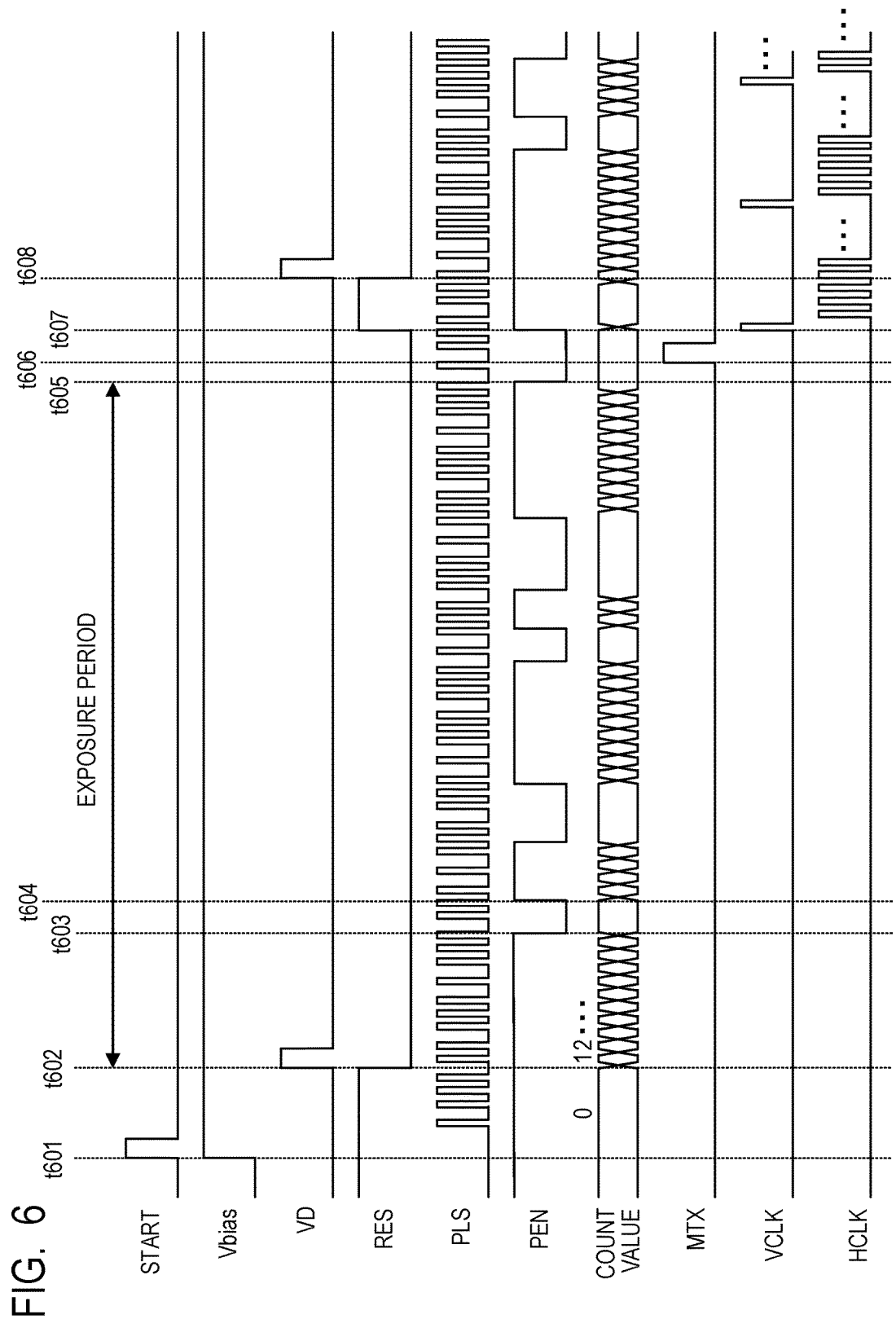
FIG. 6 is a timing chart showing operation of the solid-state image pickup element according to the first embodiment.

FIG. 6 is a timing chart showing an example of operation of the solid-state image pickup element according to the present embodiment. Although the case where photographing of a moving image is performed is described here as an example, the present invention is not limited to this.

At timing t601, when an instruction of photographing start is given by a user, or the like, via the operating part 108, the controller 104 outputs a pulse-like photographing start signal START to the solid-state image pickup element 100. When the photographing start signal START is supplied from the controller 104, the timing generator 204 supplies the bias voltage Vbias to the sensor part 300. When the bias voltage Vbias is supplied to the sensor part 300, a bias voltage greater than or equal to the breakdown voltage of the photodiode 302 is applied to the photodiode 302, resulting in the photodiode 302 operating in the Geiger mode. This leads to the sensor part 300 outputting the pulse signal PLS in response to a photon incident on the photodiode 302. At timing t601, the resetting signal RES is at H level. Moreover, at timing t601, the counter 305 is in a reset state.

At timing t602, the controller 104 starts supply of a synchronizing signal (frame synchronizing signal) VD to the solid-state image pickup element 100. Supply of the synchronizing signal VD is continued until an instruction of end of photographing of the moving image is given by a user, or the like, via the likes of the operating part 108. At timing t602, a first synchronizing signal VD is supplied to the solid-state image pickup element 100. An interval of the synchronizing signal VD is set to a frame interval corresponding to a frame rate of the moving image. When the instruction of photographing start of the moving image is received, the timing generator 204 sets the resetting signal RES to L level, and releases resetting of the counter 305. As a result, in the counter 305, the count value becomes able to increase in response to an inputted pulse signal PLS. Thus, photographing of a first frame of the moving image is started.

Timing t602 to timing t605 corresponds to an exposure period of one frame of the moving image. Timing t603 to timing t604 indicates an example of a period when the exposure pattern signal PEN is at L level. The exposure pattern signal PEN becomes L level only for an arbitrary period at an arbitrary timing. When the exposure pattern signal PEN becomes L level, the counter 305 attains the disabled state. During the disabled state, the counter 305 does not increase the count value, even when the pulse signal PLS has been inputted. Therefore, when the exposure pattern signal PEN it at L level, the counter 305 operates similarly to when exposure is not being performed. Thus, in the present embodiment, it is possible for encoded exposure to be performed, without the need for opening/closing of a shutter, or the like. Note that in order to configure so that the later-mentioned blurring repair can be optimally performed by encoding a wide range of frequency components on the time axis, the exposure pattern signal PEN supplied during the exposure period is preferably an irregular pattern having little periodicity.

Timing t605 is a timing of end of the exposure period of one frame. At timing t605, the timing generator 204 sets the exposure pattern signal PEN to L level. When the exposure pattern signal PEN becomes L level, the counter 305 attains the disabled state, and the count value of the counter 305 becomes non-increasing.

At timing t606, the timing generator 204 supplies the switches 306 provided in the counters 301 of each of the unit pixels 201 with the pulse-like control signal MTX. Specifically, the timing generator 204 supplies each of the switches 306 with an H level MTX. As a result, the switches 306 all simultaneously attain an ON state. When the switches 306 each attain the ON state, the count values of the counters 305 of each of the unit pixels 201 are respectively outputted to the read memories 307 of each of the unit pixels 201, and the count values are held in each of the read memories 307. Subsequently, when the control signal MTX returns to L level, the switches 306 attain an OFF state.

At timing t607, the timing generator 204 outputs the pulse-like resetting signal RES. As a result, the counter 305 is reset.

At timing t608, the synchronizing signal VD is supplied to the solid-state image pickup element 100 from the controller 104. As a result, photographing of the second frame is started.

At timing t607, the timing generator 204 starts supply of a VCLK signal to the vertical selector circuit 202. The vertical selector circuit 202 proceeds to sequentially select, one row at a time, the plurality of unit pixels 201 arranged in the pixel array 201, every time the pulse-like VCLK signal is inputted. The timing generator 204 supplies the horizontal selector circuit 203 with a pulse-like HCLK signal. The horizontal selector circuit 203 proceeds to sequentially select the switches 208 of each column, every time the pulse-like HCLK signal is inputted. As a result, the count values being held in each of the read memories 307 of the plurality of unit pixels 201 positioned in the row selected by the vertical selector circuit 202 are sequentially outputted to the digital output circuit 205. The digital output circuit 205 sequentially outputs to outside of the solid-state image pickup element 100 the thus read count value, that is, image signal.

Such an operation is repeated similarly to a final row, and output of the image signals from all of the unit pixels 201 is completed. Such output of the image signals is performed in parallel with image pickup of the second frame from timing t608 onward.

The image data acquired by the solid-state image pickup element 100 by performing encoded exposure undergoes various kinds of correction processing in the signal processor 101, and is then temporarily held in the memory 105. Subsequently, blurring repair processing is performed in the blurring correction part 109. The blurring correction processing is performed as below. The image data acquired by the encoded exposure is assumed to be I(x, y), an image whose blurring has been repaired is assumed to be R(x, y), a blurring speed is assumed to be a, an exposure time is assumed to be T, and an exposure pattern employed in the encoded exposure is assumed to be S(t). Now, x indicates an address of the unit pixel 201 in a horizontal direction, and y indicates an address of the unit pixel 201 in a vertical direction. A timing during the exposure period is indicated by t. S(t) expresses an exposure state at timing t, and takes a value of 0 or 1. S(t)=1 indicates being in an exposure state at timing t, that is, the counter 305 being in the enabled state at timing t. S(t)=0 indicates being in a non-exposure state at timing t, that is, the counter 305 being in the disabled state at timing t. The image data I(x, y) acquired by the encoded exposure is expressed by the following equation (1).

$$I(x,y)=\int_o^T R(x,y+\alpha t)S(t)dt \quad (1)$$

Note that the case where only blurring in a y direction has occurred during the exposure period is shown here as an example. The blurring speed a during the exposure period may be acquired by the blurring detecting part 110. Moreover, the blurring-repaired image R(x, y) can be obtained based on the above-described equation (1). The image whose blurring has been thus repaired can be displayed using the display 106. Moreover, the blurring-repaired image may be recorded on the recording medium such as a semiconductor memory, via the recording part 107. Note that technology described in Japanese Patent Application Laid-Open No. 2009-522825, for example, may be appropriately employed when obtaining the blurring-repaired image.

Thus, due to the present embodiment, a state where pulses are counted in the unit pixel 201 and a state where pulses are not counted in the unit pixel 201 may be controlled during the exposure period, with a timing based on the encoded exposure pattern. Therefore, the present embodiment makes it possible to provide a solid-state image pickup element, an image pickup apparatus, and an image pickup method that enable encoded exposure to be performed with a high temporal resolution.

(Modified Example)

Figure 7:
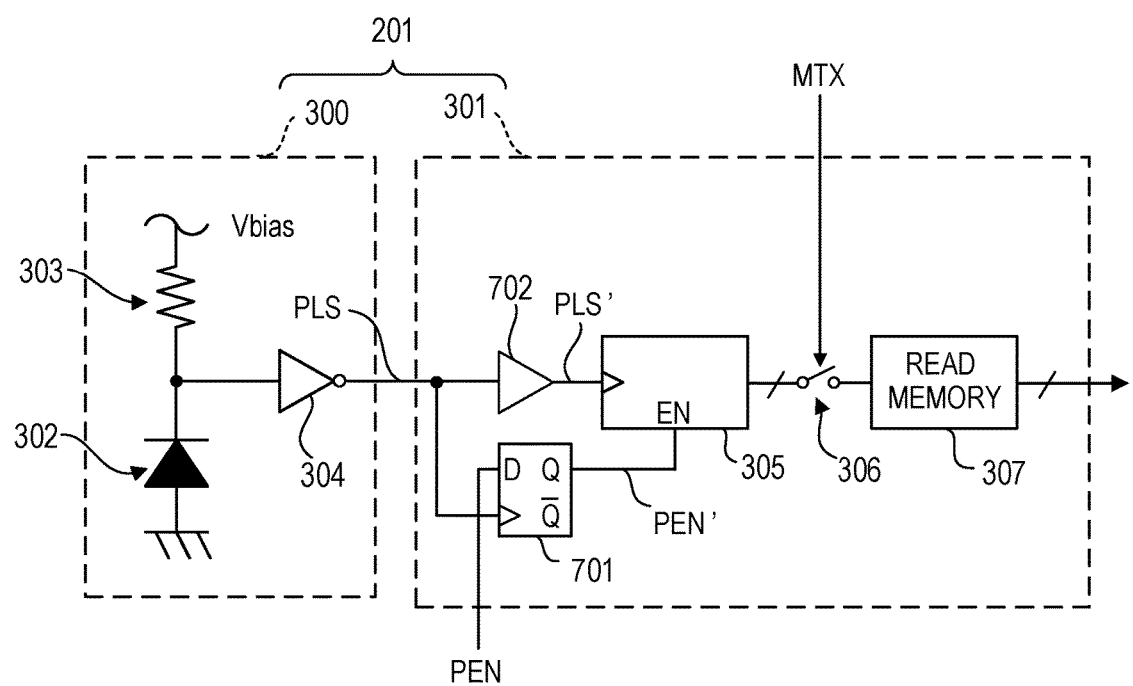
FIG. 7 is a view showing a unit pixel provided in a solid-state image pickup element according to a modified example of the first embodiment.

A solid-state image pickup element, an image pickup apparatus, and an image pickup method according to a modified example of the present embodiment will be described using FIGS. 7 and 8. FIG. 7 is a view showing a unit pixel provided in the solid-state image pickup element according to the present modified example. Configuring elements that are the same as those of the solid-state image pickup element, image pickup apparatus, and image pickup method according to the first embodiment shown in FIGS. 1 to 6 will be assigned with the same symbols as those assigned in the first embodiment, and descriptions thereof will be omitted or shortened. Note that configuring elements other than the unit pixel 201 in the solid-state image pickup element 100 according to the present modified example are similar to those of the solid-state image pickup element according to the first embodiment, hence descriptions thereof will be omitted.

The solid-state image pickup element 100 according to the present modified example achieves synchronization of the pulse signal PLS and the exposure pattern signal PEN. In the solid-state image pickup element 100 according to the first embodiment mentioned above using FIG. 3, it is not the case that synchronization between the pulse signal PLS supplied to the counter 305 and the exposure pattern signal PEN supplied from the exposure pattern supply part 206 is achieved. Therefore, depending on timings of the two, there is a possibility of glitch noise occurring on an inside of the counter 305 and operation of the counter 305 becoming unstable. Accordingly, the present modified example is configured so as to achieve synchronization of the pulse signal PLS and the exposure pattern signal PEN.

As shown in FIG. 7, the counter 301 of each of the unit pixels 201 is provided with a D type flip-flop circuit (synchronizing means, D-FF) 701. The D-FF 701 may function as a synchronizing means for synchronizing the exposure pattern signal PEN with the pulse signal PLS. A signal PEN' synchronized to the pulse signal PLS is outputted from the D-FF 701. The signal PEN' outputted from the D-FF 701 is inputted to the enable control terminal EN provided in the counter 305. The present modified example is configured so that the pulse signal PLS outputted from the sensor part 300 is inputted to the counter 305 via a buffer 702. The buffer 702 is provided for delaying a signal. The pulse signal PLS outputted from the sensor part 300 is delayed by the buffer 702, and a delayed signal PLS' is inputted to the counter 305. This results in a configuration whereby the signal PLS' rises after a predetermined time has elapsed from a timing of rise of the signal PEN'.

Figure 8:
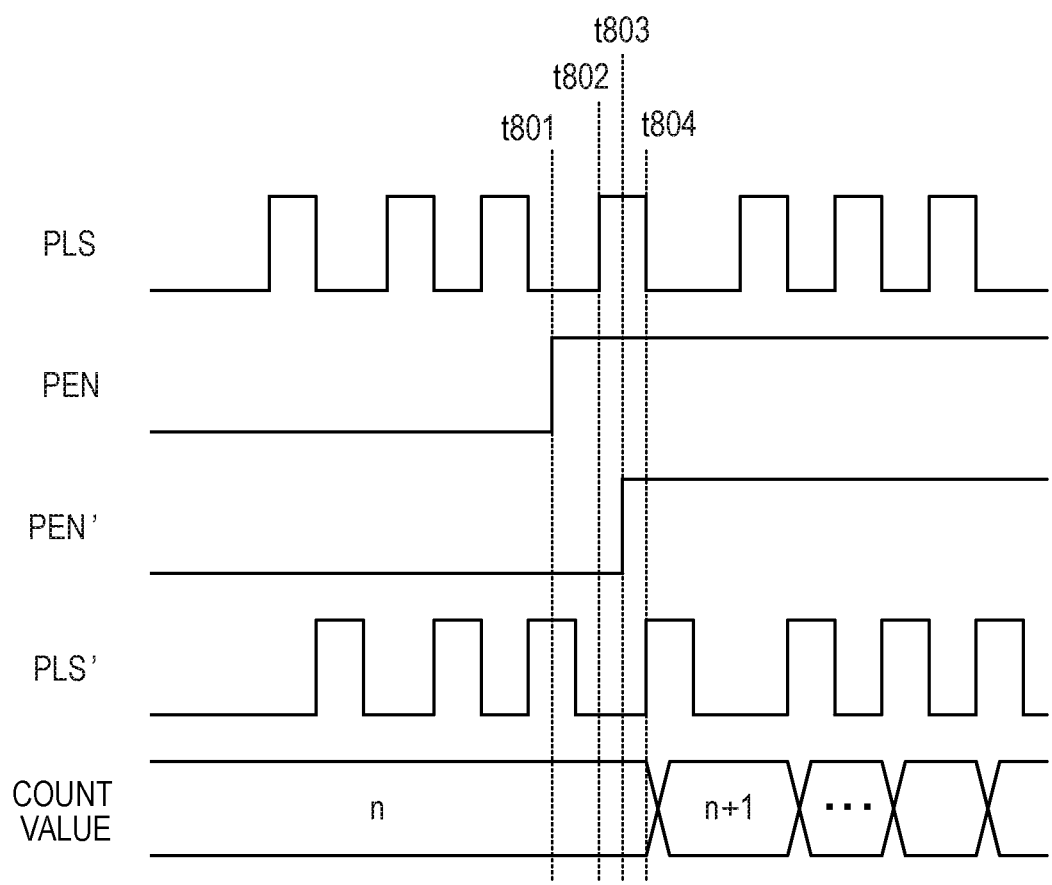
FIG. 8 is a timing chart showing operation of the solid-state image pickup element according to the modified example of the first embodiment.

FIG. 8 is a timing chart showing operation of the solid-state image pickup element according to the present modified example. FIG. 8 shows states before and after switching of the exposure pattern signal PEN is performed. Timing t801 shown in FIG. 8 corresponds to, for example, timing t604 mentioned above using FIG. 6. Note that FIG. 8 omits illustration of other than the pulse signal PLS, the exposure pattern signal PEN, the signal PEN', the signal PLS', and the count value.

At timing t801, the exposure pattern signal PEN becomes H level. Timing of the exposure pattern signal PEN is not synchronized with timing of the pulse signal PLS. At timing t802, when the pulse signal PLS becomes H level, the D-FF 701 takes in an input signal of a D terminal, that is, the exposure pattern signal PEN, at said timing t802. Then, at timing t803 after an output delay time in the D-FF 701 has elapsed, output of a Q terminal of the D-FF 701, that is, the signal PEN' changes to H level. Then, at timing t804, the signal PLS' which is the delayed pulse signal PLS becomes H level. When the signal PLS' is inputted to the counter 305, the count value in the counter 305 increases since the signal PEN' is already at H level.

Thus, because the present modified example is provided with the synchronizer which synchronizes the exposure pattern signal PEN with the pulse signal PLS, the present modified example makes it possible to prevent glitch noise from occurring in the counter 305. Therefore, the present embodiment makes it possible to provide a solid-state image pickup element, an image pickup apparatus, and an image pickup method that enable encoded exposure to be more satisfactorily performed.

[Second Embodiment]

A solid-state image pickup element, an image pickup apparatus, and an image pickup method according to a second embodiment will be described using FIGS. 9 to 11. Configuring elements that are the same as those of the solid-state image pickup element, and so on, according to the first embodiment shown in FIGS. 1 to 8 will be assigned with the same symbols as those assigned in the first embodiment, and descriptions thereof will be omitted or shortened.

A solid-state image pickup element 900 according to the present embodiment performs encoded exposure using different encoded exposure patterns for each unit pixel 201.

Figure 9:
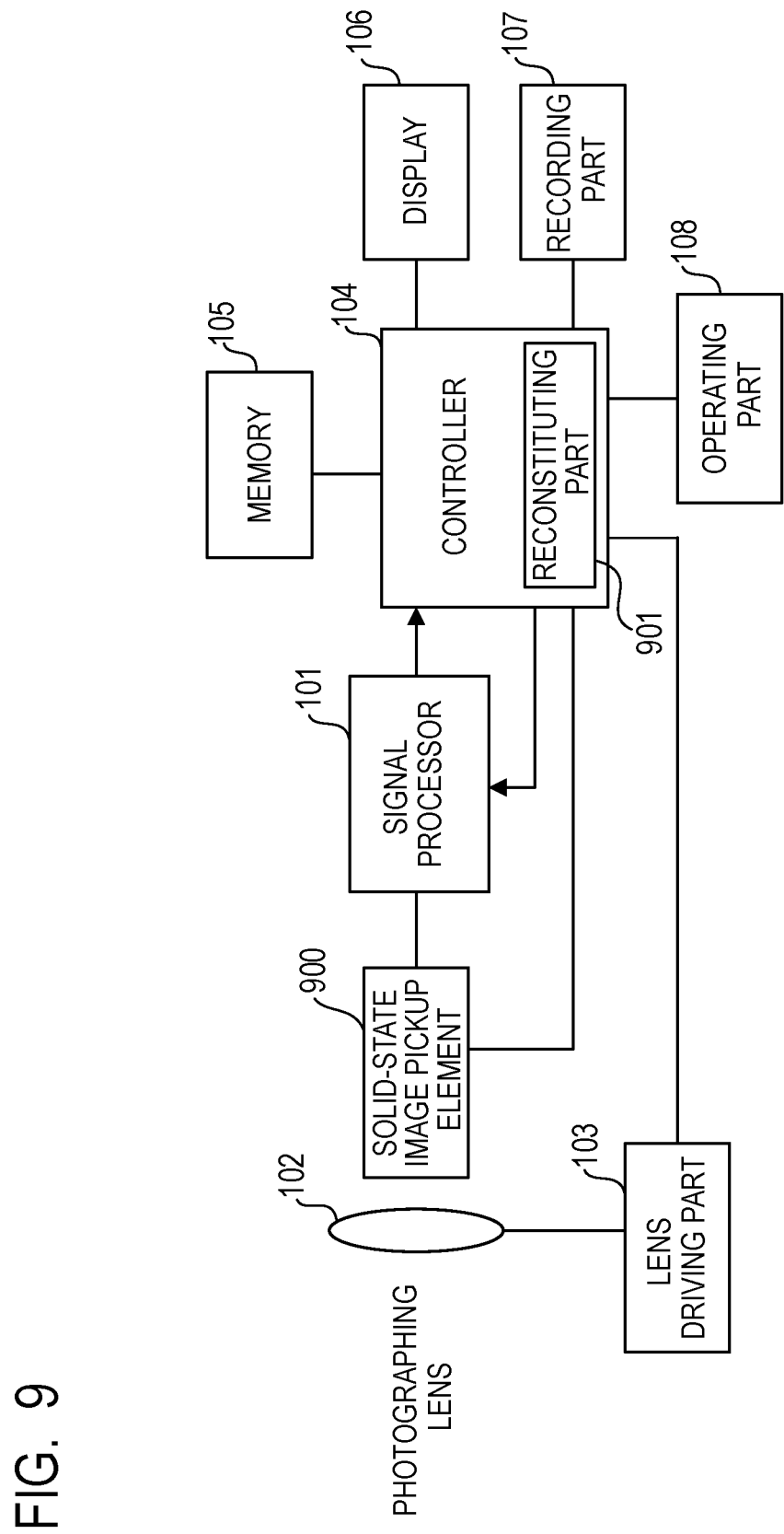
FIG. 9 is a block diagram showing an image pickup apparatus according to a second embodiment.

FIG. 9 is a block diagram showing the image pickup apparatus according to the present embodiment. The solid-state image pickup element 900 generates an image pickup signal by performing photoelectric conversion of an optical image of an object formed by the photographing lens 102, and outputs the generated image pickup signal, that is, generated image data. The solid-state image pickup element 900 generates the image data by performing encoded exposure using different encoded exposure patterns for each unit pixel 201. The image data generated by the solid-state image pickup element 900 enables a multiple frame portion of image data to be reconstituted therefrom, hence is called compressed image data. The controller 104 is provided with a reconstituting part 901. The reconstituting part 901 reconstitutes the multiple frame portion of image data, based on the compressed image data acquired by the solid-state image pickup element 900. Note that details of reconstituting processing will be mentioned later.

Figure 10:
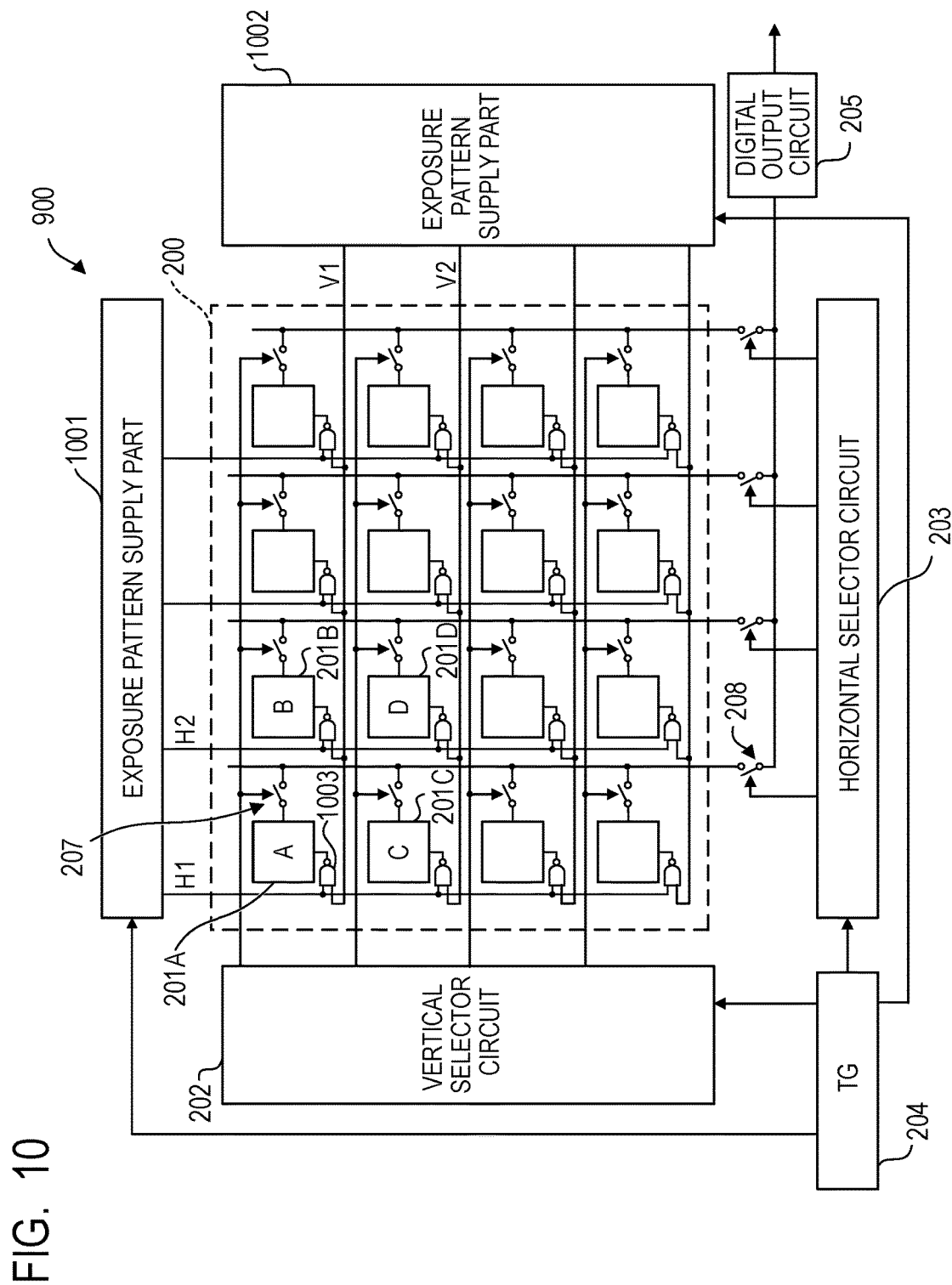
FIG. 10 is a view showing a solid-state image pickup element according to the second embodiment.

FIG. 10 is a view showing the solid-state image pickup element according to the present embodiment. As shown in FIG. 10, the solid-state image pickup element 900 according to the present embodiment includes an exposure pattern supply part (setting part, horizontal encoded exposure pattern supply part) 1001 and an exposure pattern supply part (setting part, vertical encoded exposure pattern supply part) 1002. The exposure pattern supply part 1001 supplies the pixel array 200 with exposure pattern signals (encoded exposure pattern signals) that differ for each column, via wirings H1, H2, and so on, extending in the vertical direction. The exposure pattern supply part 1002 supplies exposure pattern signals that differ for each row, via wirings V1, V2, and so on, extending in the horizontal direction. Each of the unit pixels 201 is provided with a NAND gate 1003. One input terminal of the NAND gate 1003 has the exposure pattern signal inputted thereto from the exposure pattern supply part 1001. The other input terminal of the NAND gate 1003 has the exposure pattern signal inputted thereto from the exposure pattern supply part 1002. Then, the NAND gate 1003 supplies the counter 305 of each of the unit pixels 201 with a signal obtained by carrying out a NOT-AND operation on these input signals, as the exposure pattern signal PEN. Thus, in the present embodiment, the encoded exposure patterns differ for each pixel. Note that although the case of the NAND gate 1003 being provided in each of the unit pixels 201 has been described here as an example, the present invention is not limited to this, and it is possible for another logic gate such as a NOR gate to be provided instead of the NAND gate 1003. Adopting such a configuration makes it possible to supply encoded exposure pattern signals that differ for each unit pixel 201.

Figure 11:
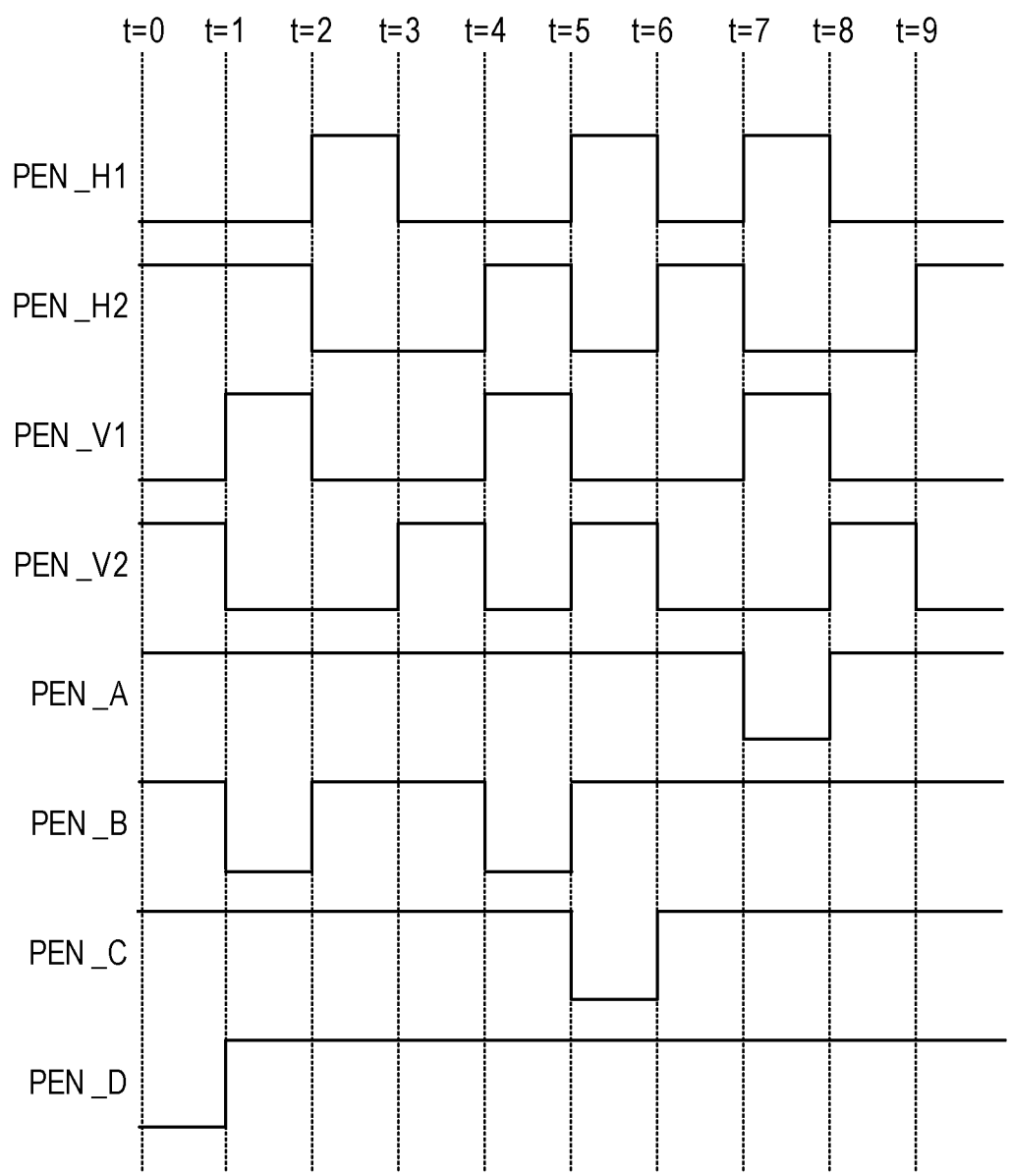
FIG. 11 is a view showing an example of an encoded exposure pattern.

FIG. 11 is a timing chart showing an example of the encoded exposure pattern. FIG. 11 shows an example of the encoded exposure pattern signal supplied during the exposure period from the exposure pattern supply part 1001 and the exposure pattern supply part 1002. The period shown in FIG. 11 corresponds to the exposure period corresponding to timing t602 to timing t605 in FIG. 6. Moreover, signals other than signals relating to the encoded exposure pattern signal are similar to in FIG. 6, hence are omitted from FIG. 11.

Signals PEN_H1, PEN_H2 indicate exposure pattern signals respectively supplied to the wirings H1, H2 from the exposure pattern supply part 1001. Signals PEN_V1, PEN_V2 indicate exposure pattern signals respectively supplied to the wirings V1, V2 from the exposure pattern supply part 1002. A signal PEN_A is an exposure pattern signal obtained by carrying out a NOT-AND operation on the signal PEN_H1 and the signal PEN_V1, and is supplied to a unit pixel 201A. A signal PEN_B is an exposure pattern signal obtained by carrying out a NOT-AND operation on the signal PEN_H2 and the signal PEN_V1, and is supplied to a unit pixel 201B. A signal PEN_C is a signal obtained by carrying out a NOT-AND operation on the signal PEN_H1 and the signal PEN_V2, and is supplied to a unit pixel 201C. A signal PEN_D is a signal obtained by carrying out a NOT-AND operation on the signal PEN_H2 and the signal PEN_V2, and is supplied to a unit pixel 201D. Thus, in the present embodiment, signals obtained by carrying out NOT-AND operations on the signals supplied from the exposure pattern supply part 1001 and the signals supplied from the exposure pattern supply part 1002, are supplied to each of the unit pixels 201.

The reconstituting part 901 performs reconstituting processing on the compressed image data acquired using the encoded exposure pattern, as follows. Assuming the compressed image data outputted from the solid-state image pickup element 900 to be I(x, y), the encoded exposure pattern employed in photographing to be S(x, y, t), and a reconstituted image to be E(x, y, t), the following equation (2) holds. Now, x is the address of the unit pixel 201 in the horizontal direction, y is the address of the unit pixel 201 in the vertical direction, t is a unit timing when switching of the encoded exposure pattern has been performed, and each takes an integer value. The encoded exposure pattern S(x, y, t) takes a value of 0 or 1. S(x, y, t)=1 indicates that the unit pixel 201 of address (x, y) is in an exposure state at timing t, that is, that the counter 305 provided in said unit pixel 201 is in the enabled state at timing t. On the other hand, S(x, y, t)=0 indicates that the unit pixel 201 of address (x, y) is in a non-exposure state at timing t, that is, that the counter 305 provided in said unit pixel 201 is in the disabled state at timing t.

$$I(x, y) = \sum_{t=1}^{N} S(x, y, t)E(x, y, t) \quad (2)$$

Therefore, a multiple frame portion of reconstituted images can be obtained from the compressed image data. Note that technology of the kind described in Japanese Patent Application Laid-Open No. 2016-39393 can be appropriately employed when obtaining the reconstituted images.

It is thus possible to configure so as to supply each of the unit pixels 201 with exposure pattern signals differing for each pixel that are generated using signals supplied from the exposure pattern supply part 1001 and signals supplied from the exposure pattern supply part 1002.

[Third Embodiment]

A solid-state image pickup element, an image pickup apparatus, and an image pickup method according to a third embodiment will be described using FIG. 12. Configuring elements that are the same as those of the solid-state image pickup element, and so on, according to the first or second embodiment shown in FIGS. 1 to 11 will be assigned with the same symbols as those assigned in the first or second embodiment, and descriptions thereof will be omitted or shortened.

In the solid-state image pickup element according to the present embodiment, a switch 1201 for controlling whether the pulse signal PLS outputted from the sensor part 300 is inputted to the counter 305, or not, is arranged between the sensor part 300 and the counter 305.

Figure 12:
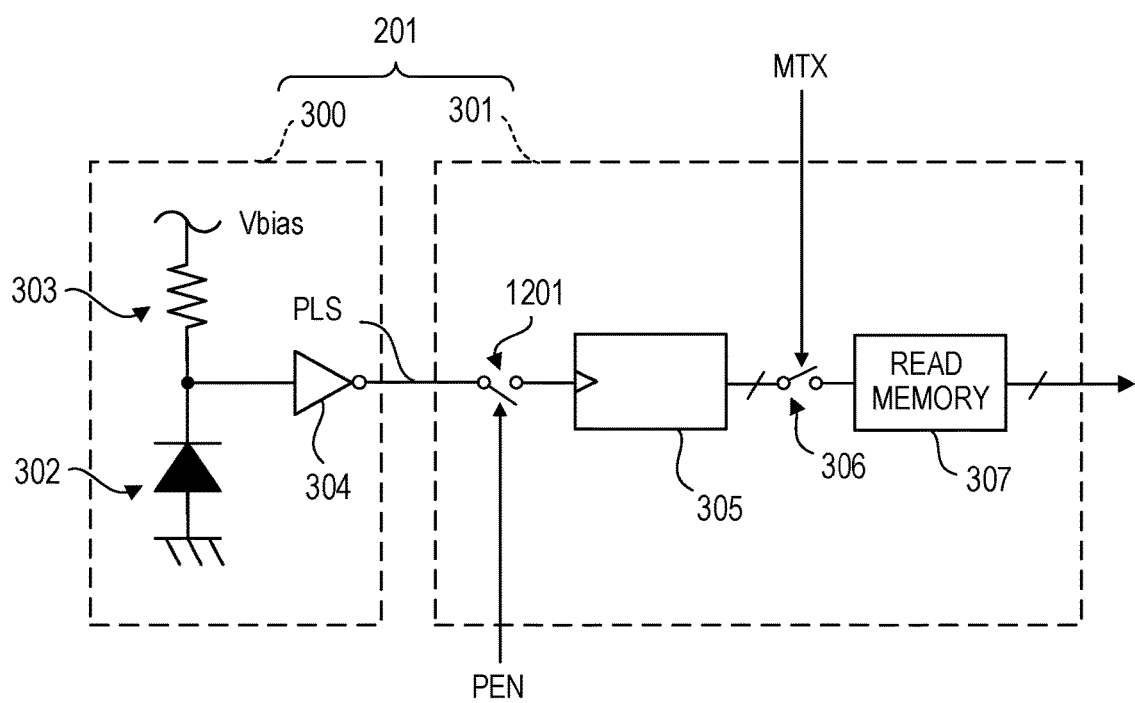
FIG. 12 is a view showing a unit pixel provided in a solid-state image pickup element according to a third embodiment.

FIG. 12 is a view showing a unit pixel provided in the solid-state image pickup element according to the present embodiment. Note that configurations other than the unit pixel 201 may be made similar to those of the first embodiment, or may be made similar to those of the second embodiment. As shown in FIG. 12, each of the counting parts 305 is provided with the switch 1201. The pulse signal PLS outputted from the sensor part 300 is inputted to the input terminal of the counter 305 via the switch 1201. The switch 1201 is for switching whether the pulse signal PLS outputted from the sensor part 300 is supplied to the counter 305, or not. The switch 1201 is supplied with the exposure pattern signal PEN. When configurations other than the unit pixel 201 are similar to in the first embodiment, the exposure pattern signal PEN is supplied to the switch 1201 from the exposure pattern supply part 206. When configurations other than the unit pixel 201 are similar to in the second embodiment, the following occurs. That is, the exposure pattern signal PEN generated using the exposure pattern signal outputted from the exposure pattern supply part 1001 and the exposure pattern signal outputted form the exposure pattern supply part 1002, is supplied to the switch 1201. When the exposure pattern signal PEN is H level, the switch 1201 attains an ON state, and the pulse signal PLS outputted from the sensor part 300 is supplied to the counter 305. On the other hand, when the exposure pattern signal PEN is L level, the switch 1201 attains an OFF state, and the pulse signal PLS outputted from the sensor part 300 is not supplied to the counter 305. Therefore, the present embodiment also makes it possible to perform encoded exposure similarly to in the first embodiment or the second embodiment.

Note that although the case of the switch 1201 being provided in each of the unit pixels 201 has been described here as an example, the present invention is not limited to this. It is possible to configure so that a logic circuit such as an AND gate is provided instead of the switch 1201, and so that the exposure pattern signal PEN is supplied to said logic circuit. It can be controlled by the exposure pattern signal PEN whether the pulse signal PLS outputted from the sensor part 300 is supplied to the counter 305, or not, also in the case where a logic circuit such as an AND gate has been employed.

Moreover, although the case of the exposure pattern signal PEN being supplied to the switch 1201 provided in the counter 301 has been described here as an example, the present invention is not limited to this. For example, it is possible to configure so that a three-state buffer is provided instead of the inverting buffer 304 provided in the sensor part 300, and so that the exposure pattern signal PEN is supplied to a control input terminal of said three-state buffer. It can be controlled by the exposure pattern signal PEN whether the pulse signal PLS is supplied to the counter 305, or not, also in the case that such a configuration has been adopted.

It is thus possible to configure so that the switch 1201, or the like, is employed to control whether the pulse signal PLS is supplied to the counter 305, or not.

[Fourth Embodiment]

A solid-state image pickup element, an image pickup apparatus, and an image pickup method according to a fourth embodiment will be described using FIG. 13. Configuring elements that are the same as those of the solid-state image pickup elements, and so on, according to the first to third embodiments shown in FIGS. 1 to 12 will be assigned with the same symbols as those assigned in the first to third embodiments, and descriptions thereof will be omitted or shortened.

In the solid-state image pickup element according to the present embodiment, the bias voltage applied to the photodiode 302 is controlled by the exposure pattern signal.

Figure 13:
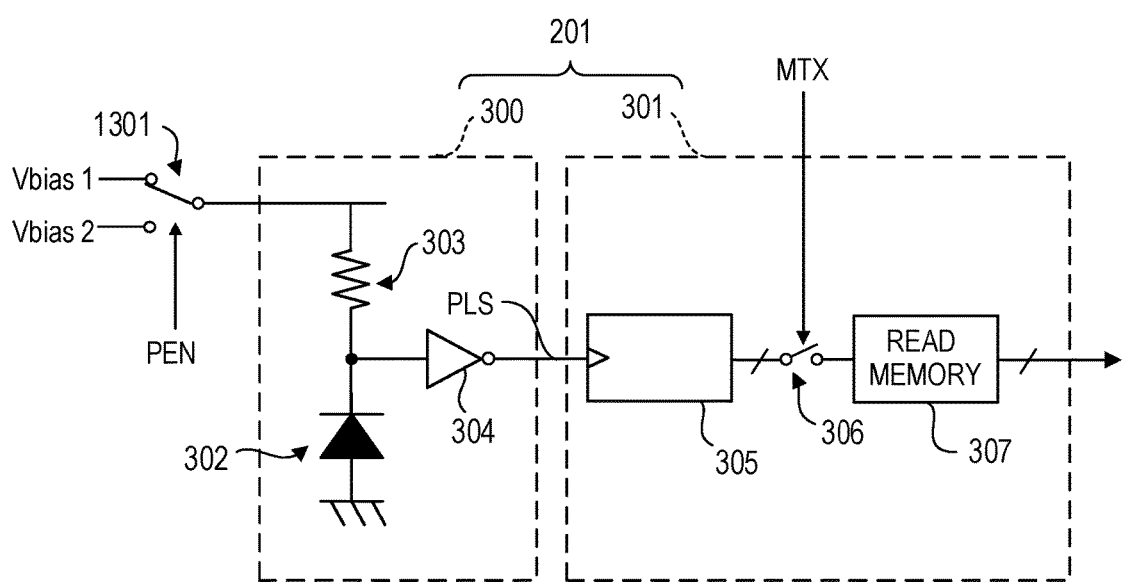
FIG. 13 is a view showing a unit pixel provided in a solid-state image pickup element according to a fourth embodiment.

FIG. 13 is a view showing a unit pixel provided in the solid-state image pickup element according to the present embodiment. Note that configurations other than the unit pixel 201 may be similar to those of the first embodiment, or may be similar to those of the second embodiment. As shown in FIG. 13, the solid-state image pickup element according to the present embodiment is provided with a switch 1301. The switch 1301 is for switching the bias voltage supplied to the photodiode 302. The switch 1301 is controlled by the exposure pattern signal PEN. The switch 1301 may function as a setting part by which a state where pulses are counted in the unit pixel 201 and a state where pulses are not counted in the unit pixel 201 are set in the exposure period, with a timing based on an arbitrary pattern. The switch 1301 may function as a setting part by which a voltage applied to the photodiode 302 as an avalanche photodiode is switched to a voltage greater than or equal to a breakdown voltage of the photodiode 302 or to a voltage less than the breakdown voltage of the photodiode 302. The switch 1301 batch-controls the bias voltages supplied to each of a plurality of the unit pixels 201. Note that although the case where the bias voltages supplied to each of a plurality of the unit pixels 201 are batch-controlled by the switch 1301 has been described here as an example, the present invention is not limited to this. It is possible to configure so that each of a plurality of the sensor parts 300 is provided with the switch 1301. Configuring so that each of a plurality of the sensor parts 300 is provided with the switch 1301 makes it possible to supply exposure pattern signals PEN that differ for each unit pixel 201.

When the exposure pattern signal PEN is H level, the photodiode 302 as the avalanche photodiode is applied with a bias voltage Vbias1 greater than or equal to the breakdown voltage. As a result, the photodiode 302 operates in the Geiger mode. Therefore, when the exposure pattern signal PEN is H level, the signal pulse PLS generated in response to incidence of a photon is outputted from the sensor part 300.

On the other hand, when the exposure pattern signal PEN is L level, the photodiode 302 is applied with a bias voltage Vbias2 less than the breakdown voltage. As a result, the photodiode does not operate in the Geiger mode. Therefore, when the exposure pattern signal PEN is L level, the signal pulse PLS is not outputted from the sensor part 300 even if a photon is incident.

It is thus possible to configure so that the bias voltage applied to the photodiode 302 is controlled by the exposure pattern signal. The present embodiment also enables encoded exposure to be performed, similarly to the first to third embodiments.

[Fifth Embodiment]

A solid-state image pickup element, an image pickup apparatus, and an image pickup method according to a fifth embodiment will be described using FIG. 14. Configuring elements that are the same as those of the solid-state image pickup elements, and so on, according to the first to fourth embodiments shown in FIGS. 1 to 13 will be assigned with the same symbols as those assigned in the first to fourth embodiments, and descriptions thereof will be omitted or shortened.

The solid-state image pickup element according to the present embodiment performs adjustment of exposure using the exposure pattern signal.

Figure 14A:
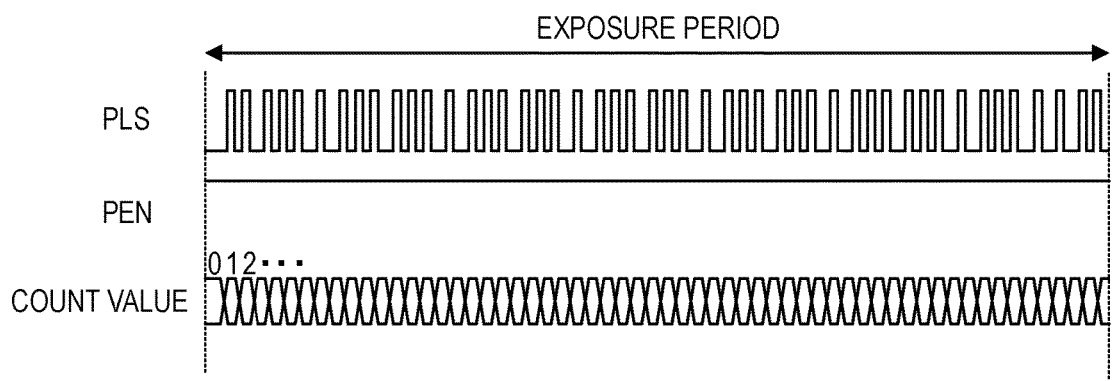
FIGS. 14A, 14B, and 14C are timing charts showing operation of a solid-state image pickup element according to a fifth embodiment.
Figure 14B:
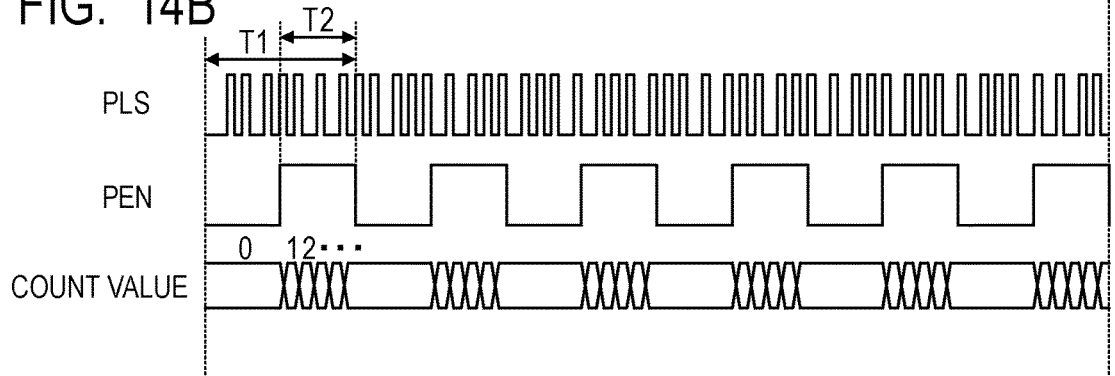
Figure 14C:
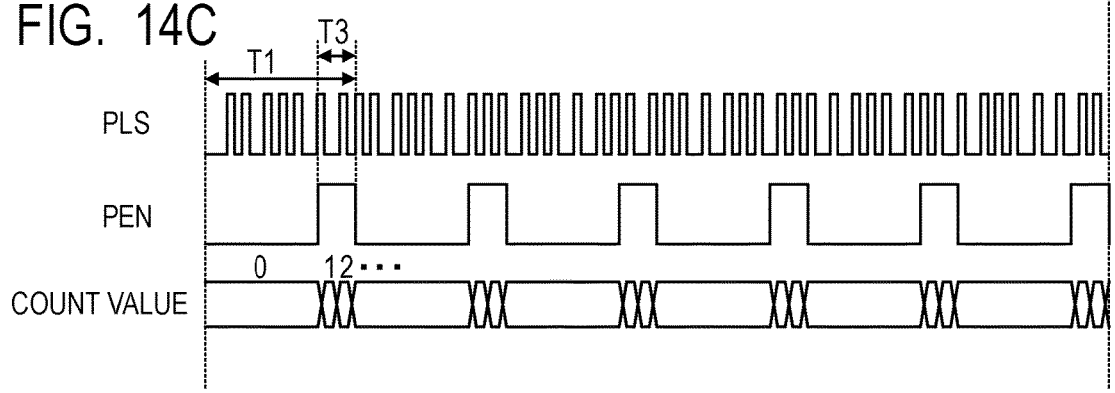

FIGS. 14A to 14C are timing charts showing operation of the solid-state image pickup element according to the present embodiment. The exposure period shown in FIGS. 14A to 14C corresponds to the exposure period corresponding to timing t602 to timing t605 in FIG. 6. FIGS. 14A to 14C show the pulse signal PLS outputted from the sensor part 300, the exposure pattern signal PEN supplied from the exposure pattern supply section 206, and the count value of the counter 305. In the present embodiment, the exposure pattern signal PEN is used to perform exposure amount adjustment (exposure adjustment), and it is not the case that the exposure pattern signal PEN is used to perform encoded exposure. Note that signals other than the pulse signal PLS, the exposure pattern signal PEN, and the count value are similar to in FIG. 6, hence are omitted from FIGS. 14A to 14C.

FIG. 14A shows the case where light reduction is not performed. As shown in FIG. 14A, the exposure pattern signal PEN is always at H level, and the count value of the counter 305 increases due to the pulse signal PLS generated by incidence of a photon.

FIG. 14B shows the case where a first stage portion of light reduction is performed. As shown in FIG. 14B, the exposure pattern signal PEN is set so that T2/T1=½. That is, in the case shown in FIG. 14B, a time that the exposure pattern signal PEN is at H level and a time that the exposure pattern signal PEN is at L level are set at 1:1. As mentioned above, the pulse signal PLS generated by incidence of a photon is counted by the counter 305 only when the exposure pattern signal PEN is H level. Therefore, in the case shown in FIG. 14B, a first stage portion more of light reduction effect is obtained, compared to in the case shown in FIG. 14A.

FIG. 14C shows the case where a second stage portion of light reduction is performed. As shown in FIG. 14C, the exposure pattern signal PEN is set so that T3/T1=¼. That is, in the case shown in FIG. 14C, a time that the exposure pattern signal PEN is at H level and a time that the exposure pattern signal PEN is at L level are set at 1:4. Therefore, in the case shown in FIG. 14C, a second stage portion more of light reduction effect is obtained, compared to in the case shown in FIG. 14A.

Thus, the exposure pattern may be a pattern for exposure amount adjustment.

[Modified Embodiments]

That concludes description of embodiments of the present invention. However, the present invention is not limited to these embodiments.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-102480, filed May 24, 2017, which is hereby incorporated by reference herein in its entirety.

What is claimed is:

1. A solid-state image pickup element comprising:
    a plurality of sensors that generate pulses with a frequency based on a reception frequency of photons; and
    at least one processor and/or circuit configured to function as following units:
        a plurality of counters that count the number of the pulses; and
        a setting part that sets, in an exposure period, a state where the pulses are counted by the plurality of counters and a state where the pulses are not counted by the plurality of counters, with a timing based on an arbitrary pattern,
    wherein each counter comprises an enable control terminal for switching between the state where the pulses are counted and the state where the pulses are not counted, and
    wherein the setting part supplies the enable control terminal with a signal of the arbitrary pattern.

2. The solid-state image pickup element according to claim 1, wherein the arbitrary pattern is a pattern for encoded exposure.

3. The solid-state image pickup element according to claim 1, wherein the arbitrary pattern differs for each counter.

4. The solid-state image pickup element according to claim 1, wherein the arbitrary pattern is a pattern for exposure amount adjustment.

5. The solid-state image pickup element according to claim 1, wherein each sensor comprises an avalanche photodiode.

6. The solid-state image pickup element according to claim 5, wherein the setting part is a switch by which a voltage applied to the avalanche photodiode is switched to a voltage greater than or equal to a breakdown voltage of the avalanche photodiode or a voltage less than the breakdown voltage of the avalanche photodiode.

7. A solid-state image pickup element comprising:
    a plurality of sensors that generate pulses with a frequency based on a reception frequency of photons; and
        at least one processor and/or circuit configured to function as following units: a plurality of counters that count the number of the pulses;
        a plurality of switches arranged between the plurality of sensors and the plurality of counters; and
        a setting part that sets, in an exposure period, a state where the pulses are counted by the plurality of counters and a state where the pulses are not counted by the plurality of counters, with a timing based on an arbitrary pattern,
    wherein each switch is controlled by a signal of the arbitrary pattern.

8. The solid-state image pickup element according to claim 7, wherein the arbitrary pattern is a pattern for encoded exposure.

9. The solid-state image pickup element according to claim 7, wherein the arbitrary pattern differs for each counter.

10. The solid-state image pickup element according to claim 7, wherein the arbitrary pattern is a pattern for exposure amount adjustment.

11. The solid-state image pickup element according to claim 7, wherein each sensor comprises an avalanche photodiode.

12. The solid-state image pickup element according to claim 11, wherein the setting part is a switch by which a voltage applied to the avalanche photodiode is switched to a voltage greater than or equal to a breakdown voltage of the avalanche photodiode or a voltage less than the breakdown voltage of the avalanche photodiode.

13. A solid-state image pickup element comprising:
    a plurality of sensors that generate pulses with a frequency based on a reception frequency of photons; and
    at least one processor and/or circuit configured to function as following units:
        a plurality of counters that count the number of the pulses;
        a setting part that sets, in an exposure period, a state where the pulses are counted by the plurality of counters and a state where the pulses are not counted by the plurality of counters, with a timing based on an arbitrary pattern; and
        a synchronizer that synchronizes a signal of the arbitrary pattern with the pulse.

14. The solid-state image pickup element according to claim 13, wherein the arbitrary pattern is a pattern for encoded exposure.

15. The solid-state image pickup element according to claim 13, wherein the arbitrary pattern differs for each counter.

16. The solid-state image pickup element according to claim 13, wherein the arbitrary pattern is a pattern for exposure amount adjustment.

17. The solid-state image pickup element according to claim 13, wherein each sensor comprises an avalanche photodiode.

18. The solid-state image pickup element according to claim 17, wherein the setting part is a switch by which a voltage applied to the avalanche photodiode is switched to a voltage greater than or equal to a breakdown voltage of the avalanche photodiode or a voltage less than the breakdown voltage of the avalanche photodiode.

19. An image pickup apparatus comprising:
    a solid-state image pickup element comprising:
        a plurality of sensors that generate pulses with a frequency based on a reception frequency of photons;
        at least one processor and/or circuit configured to function as following units:
            a plurality of counters that count the number of the pulses;
            a setting part that sets, in an exposure period, a state where the pulses are counted by the plurality of counters and a state where the pulses are not counted by the plurality of counters are set, with a timing based on an arbitrary pattern; and
            a controller that performs a predetermined processing on an image acquired by the solid-state image pickup element
    wherein each counter comprises an enable control terminal for switching between the state where the pulses are counted and the state where the pulses are not counted, and
    wherein the setting part supplies the enable control terminal with a signal of the arbitrary pattern.

20. An image pickup apparatus comprising:
    a solid-state image pickup element comprising:
        a plurality of sensors that generate pulses with a frequency based on a reception frequency of photons; and at least one processor and/or circuit configured to function as following units:
   a plurality of counters that count the number of the pulses;
   a plurality of switches arranged between the plurality of sensors and the plurality of counters;
   a setting part that sets, in an exposure period, a state where the pulses are counted by the plurality of counters and a state where the pulses are not counted by the plurality of counters are set, with a timing based on an arbitrary pattern; and
   a controller that performs a predetermined processing on an image acquired by the solid-state image pickup element,
wherein each switch is controlled by a signal of the arbitrary pattern.

21. An image pickup apparatus comprising:
a solid-state image pickup element comprising:
   a plurality of sensors that generate pulses with a frequency based on a reception frequency of photons; and
at least one processor and/or circuit configured to function as following units:
   a plurality of counters that count the number of the pulses;
   a setting part that sets, in an exposure period, a state where the pulses are counted by the plurality of counters and a state where the pulses are not counted by the plurality of counters are set, with a timing based on an arbitrary pattern;
   a synchronizer that synchronizes a signal of the arbitrary pattern with the pulse; and
   a controller that performs a predetermined processing on an image acquired by the solid-state image pickup element.

* * * * *